United States Patent

[19]

Alers et al.

[11] Patent Number: 6,046,657

[45] Date of Patent: Apr. 4, 2000

[54] MAGNETOSTRICTIVE SURFACE ACOUSTIC WAVE DEVICE AND MICROELECTRONIC CIRCUIT INCLUDING SAME

[75] Inventors: Glenn B. Alers, Chatham; Robert Bruce Van Dover, Maplewood, both of N.J.

[73] Assignee: Lucent Technologies Inc., Murray Hill, N.J.

[21] Appl. No.: 09/137,431

[22] Filed: Aug. 21, 1998

[51] Int. Cl.$^7$ .......................... H03H 9/135; H03H 9/145; H03H 9/42

[52] U.S. Cl. .......................... 333/150; 333/193; 333/201; 310/311; 310/313 R; 310/26

[58] Field of Search .................................. 333/150, 193, 333/194, 201; 310/311, 313 R, 313 B, 313 A, 357, 26

[56] References Cited

U.S. PATENT DOCUMENTS

| | | | |
|---|---|---|---|
| 3,836,876 | 9/1974 | Marshall et al. | 333/111 |
| 4,078,186 | 3/1978 | Folen et al. | 310/313 A |
| 4,137,470 | 1/1979 | Dèsormière et al. | 333/193 X |
| 4,138,651 | 2/1979 | Bongianni | 333/246 |
| 4,177,438 | 12/1979 | Vittoria | 333/152 |
| 4,308,474 | 12/1981 | Savage et al. | 310/26 |
| 4,316,162 | 2/1982 | Volluet et al. | 333/201 |
| 5,260,615 | 11/1993 | Sahashi et al. | 333/201 X |
| 5,601,935 | 2/1997 | Fujino et al. | 333/150 X |

OTHER PUBLICATIONS

Robbins, W.P. et al.; "A Simple Phenomenological Model of Tunable Saw Devices Using Magnetostrictive Thin Films"; *IEEE Transactions on Ultrasonics, Ferroelectrics and Frequency Control*, vol. 35, No. 6, Nov. 1988, pp. 718–722.

Morgan, David P., Surface–Wave Devices for Signal Processing, Studies in Electrical and Electronic Engineering 19, pp. 4–15, 1985.

R. Bruce Thompson, Generation of Horizontally Polarized Shear Waves in Ferromagnetic Materials Using Magnetostrictively Coupled Meander–Coil Electromagnetic Transducers, Rockwell International Science Center, Nov. 6, 1978, pp. 175–178.

Alekseev, A.N. Ermolov, V.A., "Efficiency of Excitation of Surface Magnetoeleastic Waves by a Meander–Line Transfer", (Eng.–Phys. Inst., Moscow USSR), Soviet Physics—Acoustics (Jul.–Aug. 1986), vol. 32, No. 4, pp. 318–319.

Voltmer, F.W., White, R.M. and Turner, C.W., "Magnetostrictive Generation of Surface Elastic Waves", Applied Physics Letters vol. 15, No. 5, Sep. 1, 1969, pp. 153–154.

*Primary Examiner*—Robert Pascal
*Assistant Examiner*—Barbara Summons

[57] ABSTRACT

An improved surface acoustic wave device includes a film of a magnetostrictive material disposed on a substrate and spaced apart input and output transducer elements disposed on the film. The input element causes horizontally polarized shear waves to propagate along the film via the magnetostriction of the film. The shear waves propagating along the film are received by the output transducer element. The SAW device can be integrated on a microelectronic circuit useable in single chip radio frequency applications.

15 Claims, 3 Drawing Sheets

MAGNETOSTRICTIVE SURFACE ACOUSTIC WAVE DEVICE AND MICROELECTRONIC CIRCUIT INCLUDING SAME

FIELD OF THE INVENTION

This invention relates to surface acoustic wave (SAW) devices, and in particular, to a SAW device that uses a meander coil and a ferromagnetic thin film to generate horizontal shear waves via the magnetostrictive effect. It also relates to silicon microelectronic circuits having such devices.

BACKGROUND OF THE INVENTION

SAW devices are essential components of RF wireless communication devices. They also have potential in other electronics applications because SAW devices exhibit low velocity non-dispersive propagation, with low attenuation up to microwave frequencies, and provide a propagation path which is accessible at the surface of the material.

A typical SAW device comprises spaced apart input and output interdigital transducers disposed on the surface of a substrate. The input transducer generates surface waves and the output transducer receives the waves. The substrate is typically about 1 mm thick and provides a propagation medium for the surface waves. Most SAW devices use a substrate composed of a high quality piezoelectric crystal, such as gallium arsenide. In operation, the input transducer generates a spatially periodic electric field in response to an applied oscillatory electrical signal or voltage. This causes a corresponding pattern of mechanical displacements or surface waves to be produced, via the piezoelectric effect. This causes a voltage to appear on the output transducer after a delay determined by the transducer separation and the surface wave velocity.

Unfortunately, SAW devices are expensive to produce because high quality piezoelectric crystalline substrates are costly. Moreover, SAW devices based on such substrates can not be readily integrated into silicon microelectronic circuits for single chip RF applications.

Accordingly, there is a need for an inexpensive SAW device that can be integrated into silicon microelectronic circuits.

SUMMARY

An improved SAW device comprises a film of magnetostrictive material disposed on a substrate and spaced apart input and output transducer elements disposed on the film. The input element causes horizontally polarized shear waves to propagate along the film via the magnetostriction of the film. The shear waves propagating along the film are received by the output transducer element. The SAW device can be integrated on a microelectronic circuit useable in single chip radio frequency applications.

BRIEF DESCRIPTION OF THE DRAWINGS

The advantages, nature and various additional features of the invention will appear more fully upon consideration of the illustrative embodiments described in detail below, considered together with the accompanying drawings. In the drawings.

It should be understood that the drawings are for purposes of illustrating the concepts of the invention and are not to scale.

DETAILED DESCRIPTION

Figure 1:
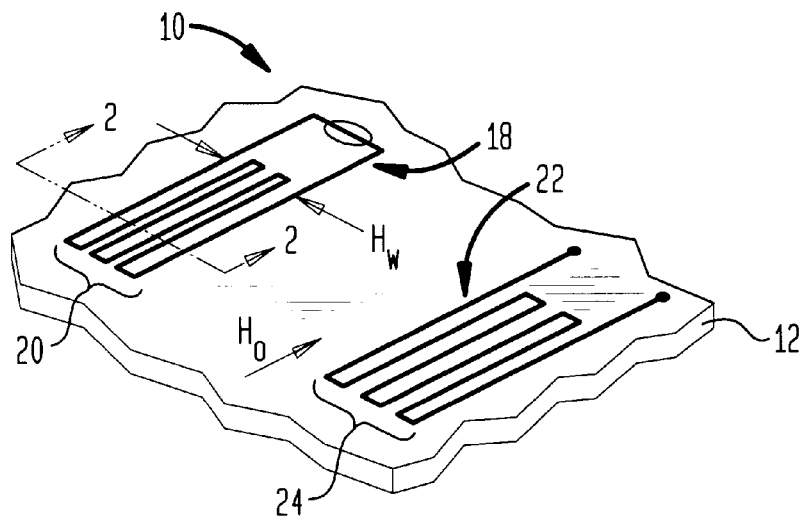
FIG. 1 is a perspective view of a SAW device.
Figure 2:
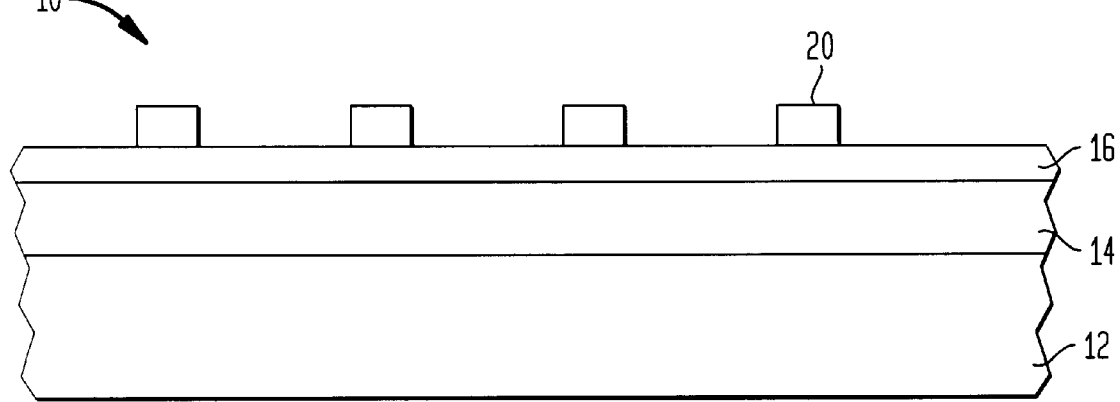
FIG. 2 is a cross-sectional view through line 2—2 of FIG. 1.

FIGS. 1 and 2 collectively show a surface acoustic wave (SAW) device 10 comprising a substrate 12 coated with a thin film 14 of magnetostrictive material followed by an insulating film 16 of dielectric material. The substrate 12 can be a silicon (Si) substrate of a microelectronic circuit having a plurality of electrically interconnected circuit components at least one of which is electrically connected to the SAW device 10. Such circuits are used in single chip radio frequency RF applications. An input magneto-elastic transducer (MET) 18 is disposed on a first region of the insulating film 16 and is driven by an oscillatory electrical signal (ac current) at a dynamic frequency $\omega$. The input MET 18 generates a spatially periodic magnetic field in response to an applied oscillatory electrical signal. This causes a corresponding pattern of mechanical displacements in the form of horizontally polarized shear (SH) waves to propagate along the thin film 14 of magnetostrictive material, via the magnetostrictive effect. An output MET 22 is disposed on a second region of the insulating film 16 spaced from the input MET 18. The output MET 22 receives the SH waves propagating along the thin film 14 of magnetostrictive material caused by the operation of the input MET 18. The output MET 22 produces a voltage in response to the receive SH waves after a delay determined by MET separation and the surface wave velocity. Each of the METs 18, 22 comprises a meander coil 20, 24 formed by a continuous, metallic conductor pattern that is deposited on the insulating film 16. The conductor pattern typically has a serpentine shape.

The magnetostrictive material used for the thin film 14 should comprise a saturation magnetostriction $\lambda_s$ greater than 10 ppm ($10 \times 10^{-6}$) and preferably greater than 20 ppm ($20 \times 10^{-6}$), a high resistivity, a small dispersion of the easy axis, and a high ferromagnetic resonance frequency. Materials meeting these criteria comprise polycrystalline ferromagnetic alloys such as $Ni_xFe_{1-x}$, preferably with $0.4 < x < 0.6$ or $0.15 < x < 0.25$ and $Co_xFe_{1-x}$, preferably with $0.3 < x < 0.7$; amorphous ferromagnetic alloys of Fe and/or Co with early transition metals such as $Co_{1-x-y}Ta_xZr_y$, preferably with $0.01 < x < 0.15$ and $0.01 < y < 0.15$, and $Co_{1-x-y}Nb_xZr_y$, preferably with $0.01 < x < 0.15$ and $0.01 < y < 0.15$; amorphous ferromagnetic alloys of Fe and/or Co with metalloids such as $Fe_{1-x-y}Co_xP_y$, preferably with $0.01 < x < 0.7$ and $0.05 < y < 0.2$; and rare-earth transition-metal ferromagnetic alloys such as $Tb_xDy_{1-x}Fe_y$, preferably with $0.2 < x < 0.3$ and $1.9 < y < 2.1$. Ferromagnetic oxides, such as $NiFe_2O_4$, $(NiZn)Fe_2O_4$, and $Fe_3O_4$, can also be used for the thin film 14. Since these oxides are insulating, they enable the insulating film 16 to be omitted.

The thin film 14 of magnetostrictive material is used as an acoustic coupling medium and the film's magnetic anisotropy is operative as an effective static bias magnetic field $H_o$ thereby generating magnetostriction in the thin film 14. This anisotropy in conjunction with pattern geometries of the film 14 self-bias the MET so that externally applied static fields are not required as is the case with bulk ferromagnetic materials. Thin films made from the magnetic materials described earlier exhibit sufficient magnetostriction to enable the SAW device 10 to generate SH waves.

In operation, the effective static bias magnetic field $H_o$ induces a single-magnetic-domain state. The ac current in the MET 18 creates an oscillating field HO that adds perpendicularly to the static bias field $H_o$, and rotates the magnetization in the surface plane of the device 10 creating a shear strain. The amplitude of the SH wave obeys the relationship:

$$\Psi \, \delta h \, |\partial \epsilon_{xy}/\partial H_\omega|,$$

where $\epsilon_{xy}$ is the magnetostrictive shear strain induced by $H_o$ and $H_\omega$ (the derivative $\partial \epsilon_{xy}/\partial H\omega$ is referred to as magnetostrictive strain coefficient), h is the magnitude of $H_\omega$ at the surface of the device, $\delta$ is the skin depth square root of $2/(\beta\sigma\omega)$, where $\beta$ is the transverse incremental permeability, $\sigma$ is the conductivity, and $\omega$ is the angular frequency. In high static bias fields, where the magnetization remains nearly parallel to the total magnetic field, $\partial \epsilon_{xy}/\partial H_\omega \approx 3\lambda_y/2Ho_o$, where $\lambda_y$ is the magnetostriction coefficient (the longitudinal strain due to $H_o$).

Figure 3:
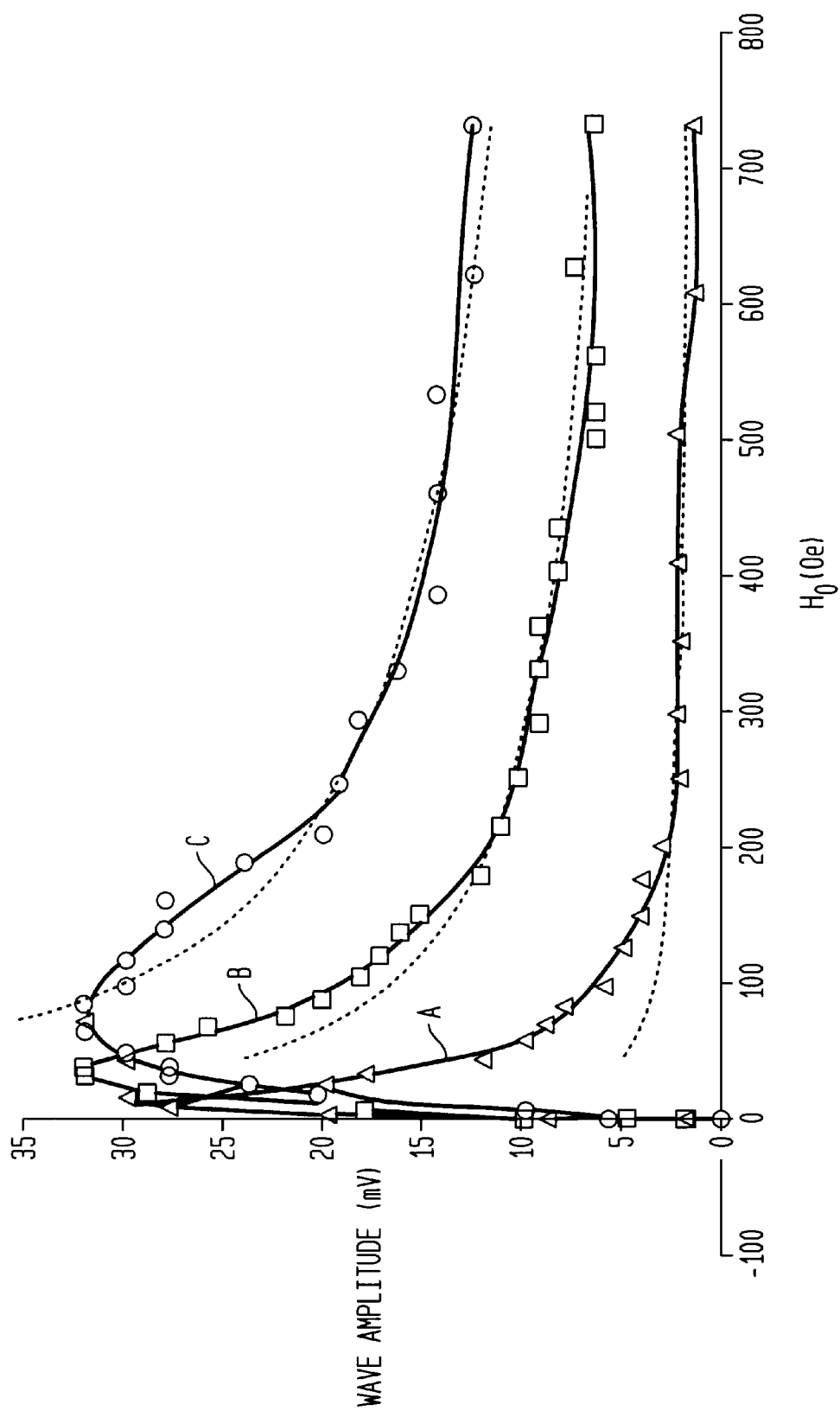
FIG. 3 is a graph showing the amplitudes of SH waves generated by the input MET of a SAW device similar to that shown in FIGS. 1 and 2, as the static bias magnetic field $H_o$ is decreased from near-saturation levels.

FIG. 3 is a graph showing the amplitudes of SH waves generated by the input MET of a SAW device similar to that shown in FIGS. 1 and 2, as the static bias magnetic field $H_o$ is increased from zero to a high value. The SAW device included a thin film of amorphous CoTaZr deposited on a Si substrate and a 6 mm wavelength input meander coil. The amplitudes of the SH waves were generated at peak transducer driving currents of 25 amps (curve A), 5 amps (curve B), and 1 amp (curve C). The measurement frequency was 771 kHz. The graph shows that for static bias fields $H_o$ above 200 oersteds (Oe), the SH wave amplitudes generated by the SAW device decreased as a function of 1/(square root of $H_o$) as indicated by the dotted lines. For static bias fields $H_o$ above 400 Oe, the SAW device generated SH wave amplitudes which increased linearly with the driving current of the MET. Maximum SH wave amplitudes were observed at low bias fields $H_o$. As the MET current was decreased, the amplitude peaks of the SH waves shifted to lower static bias fields $H_o$, with minimal changes in the height of the amplitude peaks.

Figure 4:
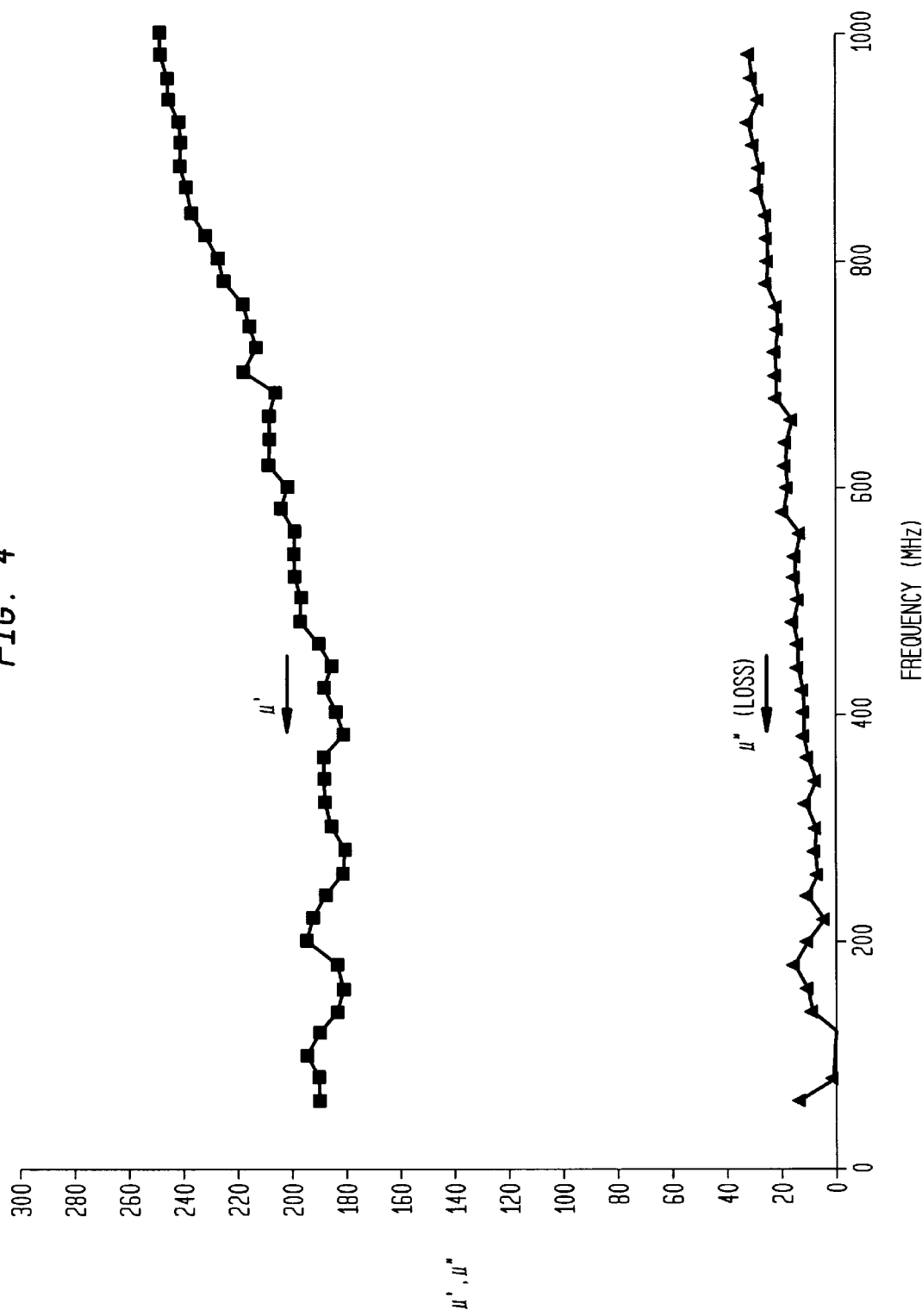
FIG. 4 is a graph showing the complex permeability of a CoTaZr film at a magnetic field strength of 40 Oe.

In addition to high magnetostriction, thin films selected from the magnetic materials described above also exhibit low dispersion and a ferromagnetic resonance frequency in the GHz range. This enables the SAW device to be advantageously used in RF applications. FIG. 4 is a graph showing the complex permeability of a CoTaZr film at a magnetic field strength of 40 Oe. The graph shows the magnetic permeability $\mu'$ of the film vs. frequency and the loss $\mu''$ of the film vs. frequency. The CoTaZr film provides low dispersion and a ferromagnetic resonance frequency in the GHz range. The measured permeability $\mu'$ is consistent with coherent rotation of the magnetization.

The magnetic and insulating films of the SAW device can be deposited on the substrate using established thin film deposition methods. The thin film 14 of magnetostrictive material has a thickness which is typically about 0.1–1.0 um and the insulating film has a typical thickness of about 0.1–1.0 um. The meander coils of the SAW device can be made by depositing a metal film of aluminum having a thickness typically about 0.5 um. The conductor pattern is then defined in the metal film using conventional lithography methods. Because the SAW device is especially suited for fabrication on Si substrates, integration into a Si-based microelectronic circuit is possible. Moreover, thin films of magnetostrictive material are compatible with current microelectronic devices.

It should be understood that the above described embodiments are illustrative of only a few of the many possible specific embodiments which can represent applications of the principles of the invention. Numerous and varied other arrangements can also be devised by those skilled in the art without departing from the spirit and scope of the invention.

What is claimed is:

1. A microelectronic circuit comprising:
    a substrate having a plurality of interconnected microcircuit elements;
    a surface acoustic wave device interconnected with at least one of the microelectronic circuit elements, the device comprising:
        a film of a magnetostrictive material disposed on a region of the substrate;
        an input transducer element disposed on the film for causing horizontally polarized shear waves to propagate along the film via the magnetostriction of the film; and
        an output transducer element disposed on the film and spaced from the input transducer, for receiving the shear waves propagating in the film.

2. The circuit according to claim 1, wherein the magnetostrictive material has a saturation magnetostriction greater than 10 ppm.

3. The circuit according to claim 1, wherein the magnetostrictive material has a saturation magnetostriction greater than 20 ppm.

4. The circuit according to claim 1, wherein the magnetostrictive material is selected from the group consisting of amorphous ferromagnetic alloys, polycrystalline ferromagnetic alloys, amorphous alloys of Fe with early transition metals, amorphous alloys of Co with early transition metals, amorphous alloys of Fe and Co with early transition metals, amorphous alloys of Fe with metalloids, amorphous alloys of Co with metalloids, amorphous alloys of Fe and Co with metalloids, rare-earth transition metal ferromagnetic alloys, and ferromagnetic oxides.

5. The circuit according to claim 4, wherein the magnetostrictive material has a saturation magnetostriction greater than 10 ppm.

6. The circuit according to claim 4, wherein the magnetostrictive material has a saturation magnetostriction greater than 20 ppm.

7. The circuit according to claim 1, wherein each of the transducer elements comprises a magneto-elastic transducer.

8. The circuit according to claim 1, wherein each of the transducer elements comprises a continuous, metallic conductor pattern.

9. The circuit according to claim 1, further comprising a film of an insulating material between the transducers elements and the film.

10. The circuit according to claim 9, wherein the magnetostrictive material is selected from the group consisting of amorphous ferromagnetic alloys, polycrystalline ferromagnetic alloys, amorphous alloys of Fe with early transition metals, amorphous alloys of Co with early transition metals, amorphous alloys of Fe and Co with early transition metals, amorphous alloys of Fe with metalloids, amorphous alloys of Co with metalloids, amorphous alloys of Fe and Co with metalloids, and rare-earth transition metal ferromagnetic alloys.

11. The circuit according to claim 10, wherein the magnetostrictive material has a saturation magnetostriction greater than 10 ppm.

12. The circuit according to claim 10, wherein the magnetostrictive material has a saturation magnetostriction greater than 20 ppm.

13. The circuit according to claim 1, wherein the substrate comprises silicon.

14. The circuit according to claim 1 wherein the magnetostrictive material is selected from the group consisting of:
$Ni_xFe_{1-x}$, $Co_xFe_{1-y}Ta_xZr_yCo_{1-x-y}Nb_xZr_y$, $Fe_{1-x-y}Co_xP_y$, $Tb_xDy_{1-x}Fe_y$, $NiFe_2O_4$, (NiZn) $Fe_2O_4$ and $Fe_3O_4$, where x and y are non-zero.

15. A surface acoustic wave device comprising:

a film of a magnetostrictive material having a saturation magnetostriction greater than 20 ppm disposed on a silicon substrate:

an input magneto-elastic transducer element disposed on the film for causing horizontally polarized shear waves to propagate along the film via the magnetostriction of the film; and an output magneto-elastic transducer element disposed on the film and spaced from the input transducer, for receiving the shear waves propagating in the film;

wherein the magnetostrictive material is selected from the group consisting of $Ni_xFe_{1-x}$, $Co_xFe_{1-x}$, $Co_{1-x-y}Ta_xZr_y$, $Co_{1-x-y}Nb_xZr_y$, $Fe_{1-x-y}Co_xP_y$, $Tb_xDy_{1-x}Fe_y$, $NiFe_2O_4$, (NiZn) $Fe_2O_4$ and $Fe_3O_4$, where x and y are non-zero.

* * * * *